(12) United States Patent
Leobandung

(10) Patent No.: US 9,882,047 B2
(45) Date of Patent: Jan. 30, 2018

(54) SELF-ALIGNED REPLACEMENT METAL GATE SPACERLESS VERTICAL FIELD EFFECT TRANSISTOR

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 15/012,468

(22) Filed: Feb. 1, 2016

(65) Prior Publication Data
US 2017/0222045 A1    Aug. 3, 2017

(51) Int. Cl.
| | |
|---|---|
| H01L 29/78 | (2006.01) |
| H01L 29/06 | (2006.01) |
| H01L 21/02 | (2006.01) |
| H01L 21/306 | (2006.01) |
| H01L 29/423 | (2006.01) |
| H01L 29/66 | (2006.01) |
| H01L 29/08 | (2006.01) |

(52) U.S. Cl.
CPC .... *H01L 29/7827* (2013.01); *H01L 21/02603* (2013.01); *H01L 21/30604* (2013.01); *H01L 29/0649* (2013.01); *H01L 29/0676* (2013.01); *H01L 29/0847* (2013.01); *H01L 29/42392* (2013.01); *H01L 29/66545* (2013.01); *H01L 29/66666* (2013.01)

(58) Field of Classification Search
CPC ........... H01L 29/66666; H01L 29/0676; H01L 29/0673
See application file for complete search history.

(56) References Cited

U.S. PATENT DOCUMENTS

| | | |
|---|---|---|
| 6,027,975 A | 2/2000 | Hergenrother et al. |
| 6,197,641 B1 | 3/2001 | Hergenrother et al. |
| 6,821,851 B2 | 11/2004 | Hergenrother et al. |
| 7,033,877 B2 | 4/2006 | Chaudhry et al. |
| 7,259,048 B2 | 8/2007 | Chaudhry et al. |
| 8,872,154 B2 | 10/2014 | Franklin et al. |
| 9,087,863 B2 | 7/2015 | Cea et al. |

(Continued)

OTHER PUBLICATIONS

Hergenrother, J.M., et al., "The Vertical Replacement-Gate (VRG) MOSFET: A 50-nm Vertical MOSFET with Lithography-Independent Gate Length", Electron Devices Meeting, IEDM, Technical Digest, Dec. 1999, pp. 75-78.

*Primary Examiner* — Samuel Gebremariam
*Assistant Examiner* — Jonas T Beardsley
(74) *Attorney, Agent, or Firm* — Scully, Scott, Murphy & Presser, P.C.; Louis J. Percello, Esq.

(57) ABSTRACT

A method of making a vertical field effect transistor includes forming a semiconductor nanowire that extends from a substrate surface. A first sacrificial layer is deposited over the substrate surface, and a second sacrificial layer is deposited over the first sacrificial layer such that each of the first and second sacrificial layers are formed peripheral to the nanowire. The second sacrificial layer is then patterned to form a dummy gate structure. Thereafter, the first sacrificial layer is removed and source and drain regions are deposited via epitaxy directly over respective portions of the nanowire.

11 Claims, 11 Drawing Sheets

(56) References Cited

U.S. PATENT DOCUMENTS

| | | | |
|---|---|---|---|
| 2006/0024945 A1* | 2/2006 | Kim | H01L 21/0332 |
| | | | 438/618 |
| 2006/0172497 A1* | 8/2006 | Hareland | H01L 29/42384 |
| | | | 438/286 |
| 2013/0240983 A1* | 9/2013 | Larrieu | B82Y 10/00 |
| | | | 257/329 |
| 2014/0030859 A1* | 1/2014 | Xie | H01L 21/82381 |
| | | | 438/199 |
| 2015/0171206 A1* | 6/2015 | van Dal | H01L 29/66522 |
| | | | 257/192 |
| 2015/0214058 A1 | 7/2015 | Basker et al. | |
| 2015/0325575 A1* | 11/2015 | Park | H01L 29/0653 |
| | | | 257/401 |
| 2016/0087053 A1* | 3/2016 | Kim | H01L 29/41783 |
| | | | 257/369 |

* cited by examiner

SELF-ALIGNED REPLACEMENT METAL GATE SPACERLESS VERTICAL FIELD EFFECT TRANSISTOR

BACKGROUND

The present application relates generally to semiconductor devices, and more specifically to vertical field effect transistors (VFETs) and their methods of production.

Conventional vertical FETs are devices where the source-drain current flows in a direction normal to the substrate surface. In such devices, a vertical pillar defines the channel with the source and drain located at opposing ends of the pillar. An advantage of the vertical FET is that the channel length is not defined by lithography, but by methods such as epitaxy or layer deposition, which enable precise dimensional control.

Modern transistors are manufactured using gate-first or gate-last (also known as replacement metal gate) process flows, which may include hybrid approaches such as a gate-first method for NMOS and a gate-last method for the more difficult PMOS transistor. With the proliferation of high-k dielectrics (e.g., dielectric materials having a dielectric constant greater than silicon nitride), it has been suggested that the high-temperature steps that follow high-k and metal gate depositions cause an adverse shift in threshold voltage, affecting PMOS performance in particular.

In view of the foregoing, it would be advantageous to provide a manufacturing process for a vertical field effect transistor that is compatible with a gate-last approach.

SUMMARY

In accordance with embodiments of the present application, a method of fabricating a vertical field effect transistor includes forming a semiconductor nanowire that extends from a substrate surface. A first sacrificial layer is deposited over the substrate surface, and a second sacrificial layer is deposited over the first sacrificial layer where each of the first and second sacrificial layers are formed peripheral to the nanowire. The second sacrificial layer is patterned to form a dummy gate structure. Thereafter, the first sacrificial layer is removed and source and drain regions are deposited via epitaxy directly over respective portions of the nanowire.

According to further embodiments, a semiconductor structure includes a semiconductor nanowire having a channel segment between source and drain segments that are located in distal ends of the nanowire, where the semiconductor nanowire extends from a substrate surface. An epitaxial source region is located over the source segment of the nanowire, and an epitaxial drain region is located over the drain segment of the nanowire. A gate stack includes a conformal dielectric layer that is located over the channel segment of the nanowire and a conductive layer located over the dielectric layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
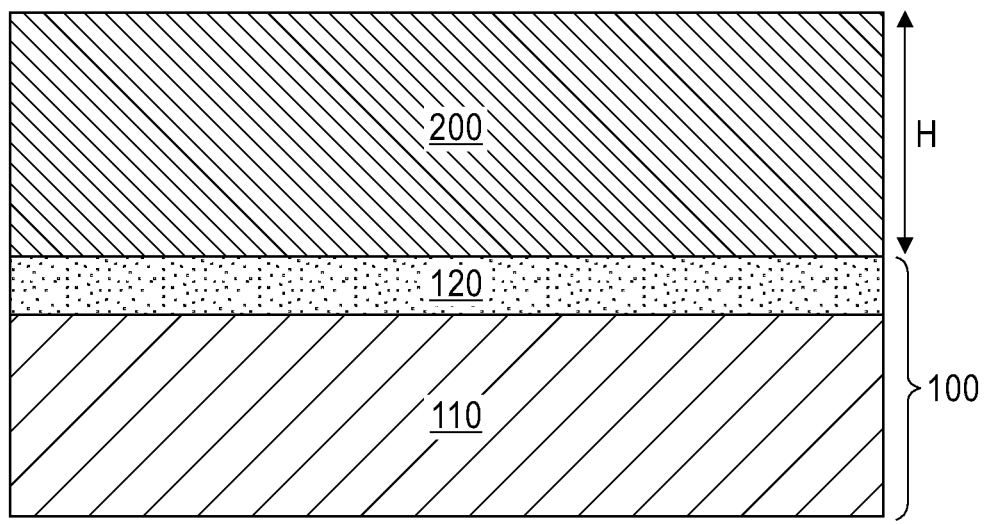
FIG. 1 shows an example semiconductor substrate used in conjunction with various embodiments.

Reference will now be made in greater detail to various embodiments of the subject matter of the present application, some embodiments of which are illustrated in the accompanying drawings. The same reference numerals will be used throughout the drawings to refer to the same or similar parts.

Figure 2:
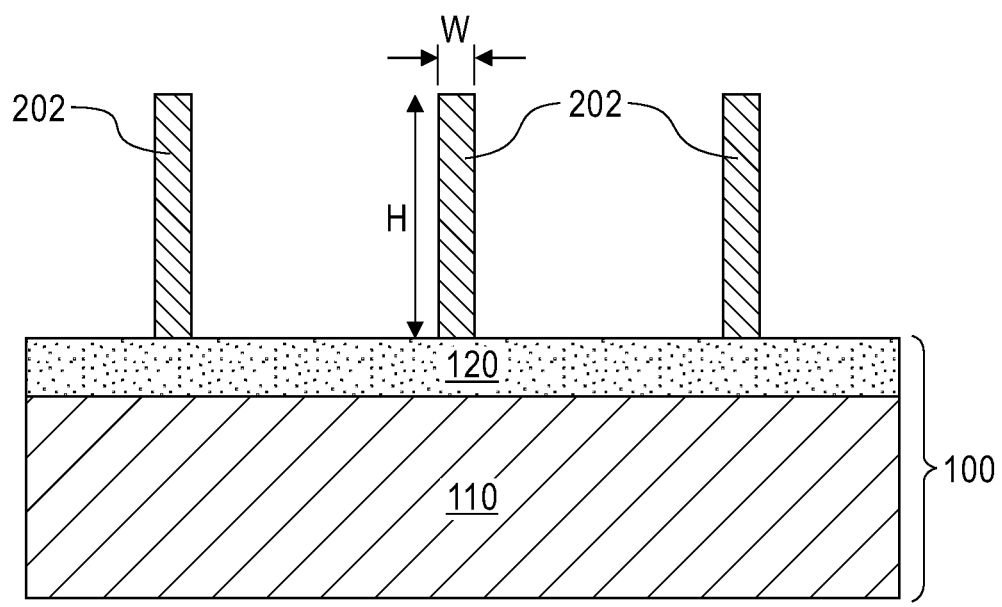
FIG. 2 is a schematic diagram of vertically-oriented nanowires formed over an isolation layer of a substrate according to various embodiments.

With reference to FIGS. 1 and 2, a plurality of nanowires 202 are formed on an isolation layer 120 of substrate 100; substrate 100 may include a handle substrate 110 which may be composed of any semiconductor material or a remaining portion of a bulk semiconductor substrate. Substrate 100 may be a semiconductor material such as silicon or a silicon-containing material, including a bulk substrate. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multi-layers thereof. Example silicon substrates include silicon-on-insulator (SOI) substrates, silicon-on-sapphire (SOS) substrates, and the like. As used herein, the term "single crystal" denotes a crystalline solid, in which the crystal lattice of the entire sample is substantially continuous and substantially unbroken to the edges of the sample with substantially no grain boundaries.

Substrate 100 is not limited to silicon-containing materials, as the substrate 100 may comprise other semiconductor materials, including Ge and compound semiconductors such as GaAs, InAs and other like semiconductors.

The isolation layer 120 may comprise the buried oxide (BOX) layer of a semiconductor-on-insulator (SOI) substrate, or an oxidized layer of a bulk silicon substrate. The thickness of the isolation layer 120 may range from 30 to 300 nm, e.g., 30, 50, 100, 150, 200, 250 or 300 nm, including ranges between any of the foregoing values. The isolation layer 120 may comprise, for example, silicon dioxide (SiO$_2$). The supporting substrate 110 may comprise (100)-oriented silicon or (111)-oriented silicon, for example.

The substrate 100 may have dimensions as typically used in the art. Example substrate diameters include, but are not limited to, 50, 100, 150, 200, 300 and 450 mm. The total substrate thickness may range from 250 microns to 1500 microns, though in particular embodiments the substrate thickness is in the range of 725 to 775 microns, which corresponds to thickness dimensions commonly used in silicon CMOS processing.

Nanowires 202 comprise a semiconductor material such as silicon, and may be formed by patterning and then etching a layer 200 of semiconductor material disposed on substrate 100. As an alternative to silicon, nanowires may comprise germanium (Ge), silicon germanium (SiGe), III-V compound semiconductors such as GaAs, GaN, GaP, InAs, InSb, ZnSe, and ZnS, and II-VI compound semiconductors such as CdSe, CdS, CdTe, ZnSe, ZnS and ZnTe.

The patterning process may comprise photolithography, which includes forming a layer of photoresist material (not shown) atop a material or material stack to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. In the instant embodiment, this provides a patterned layer of photoresist atop a portion of the semiconductor layer 200. The pattern provided by the patterned photoresist material is thereafter transferred into the underlying material layer or material layers utilizing at least one pattern transfer etching process.

The pattern transfer etching process is an anisotropic etch. In embodiments, a dry etching process such as, for example, reactive ion etching can be used. In other embodiments, a wet chemical etchant can be used. In still further embodiments, a combination of dry etching and wet etching can be used. The pattern transfer etching may stop on the isolation layer 120, or a portion of the isolation layer 120 may be removed during the formation of the nanowires 202.

In some embodiments of the present application, the nanowires 202 may be formed utilizing a sidewall image transfer (SIT) patterning process. SIT includes forming mandrel structures on a material or material stack to be patterned, then forming spacers along the sidewalls of each mandrel structure, and thereafter removing each mandrel structure. An etch, as described above, is then employed utilizing each spacer as an etch mask. After etching, i.e., pattern transfer, each spacer is then removed from the structure.

In embodiments, nanowires 202 are formed from a crystalline semiconductor material. The semiconductor material forming nanowires 202 may be doped, undoped, or contain doped and undoped regions therein. Each doped region within the semiconductor nanowires 202 may have the same or different doping concentrations and/or conductivities. Doped regions that are present can be formed, for example, by ion implantation, gas phase doping, or by dopants that are present in the material used to form the nanowires. For instance, semiconductor layer 200 may comprise a dopant prior to forming the nanowires 202. By way of example, semiconductor layer 200 and hence nanowires 202 may be initially and uniformly doped and have a dopant concentration in the range of $1 \times 10^{15}$ atoms/cm$^3$ to $1 \times 10^{18}$ atoms/cm$^3$.

In embodiments, nanowires 202 are free standing, i.e., supported only by the substrate 100. The nanowires 202 have a uniform height H of 50 to 200 nm, e.g., 50, 100, 150 or 200 nm, including ranges between any of the foregoing values. The nanowires 202 may have a circular cross section characterized by a diameter of 1 to 50 nm, e.g., 1, 2, 5, 10, 20 or 50 nm, including ranges between any of the foregoing values. In alternate embodiments, nanowires 202 have a rectangular or square cross section characterized by a length L and a width W that may independently range from 1 to 50 nm, e.g., 1, 2, 5, 10, 20 or 50 nm, including ranges between any of the foregoing values. The nanowires 202 may be arranged in a regular array that, in embodiments, has a nanowire-to-nanowire spacing (i.e., pitch) of 10 to 1000 nm.

Figure 3:
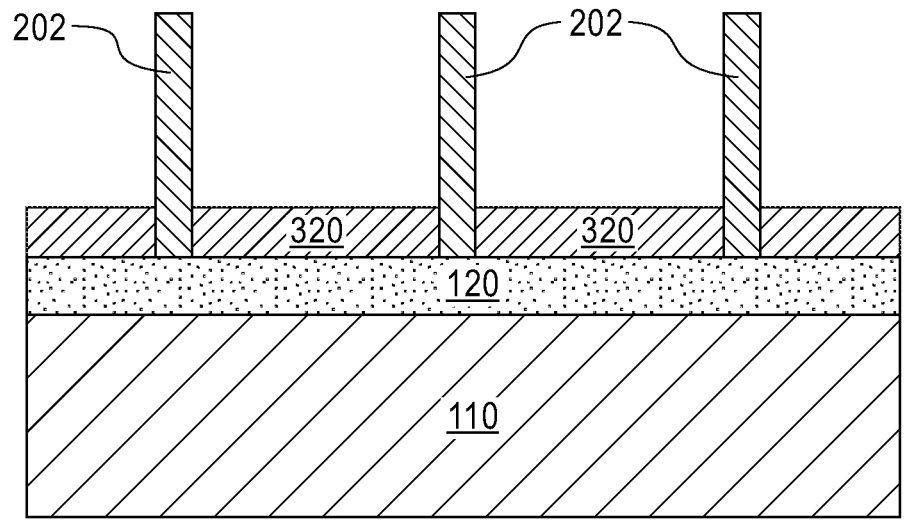
FIG. 3 shows the formation of a first sacrificial layer adjacent to the nanowires and over the isolation layer.

As depicted in FIG. 3, after formation of nanowires 202, a first sacrificial layer 320 is formed over the isolation layer 120 and adjacent to the nanowires 202. In embodiments, first sacrificial layer 320 is in direct physical contact with the isolation layer 120 and with lower portions of the sidewalls of the nanowires 202. In embodiments, first sacrificial layer 320 can be selectively etched with respect to one or more of silicon, silicon dioxide and silicon nitride. First sacrificial layer 320 is configured to be later removed selective to both the isolation layer and nanowire materials. By way of example, the first sacrificial layer 320 may comprise amorphous carbon or a porous dielectric and may have a thickness of 10 to 50 nm.

An amorphous carbon (a-C) layer or hydrogenated amorphous carbon (a-C:H) layer may be deposited from an argon/hydrocarbon gas/hydrogen/oxygen plasma or an argon/acetylene-helium/hydrogen/oxygen plasma, for example. In embodiments, the hydrocarbon gas used to form an amorphous carbon layer may be any hydrocarbon compound that capable of forming a plasma. The term 'hydrocarbon' refers to a compound that contains only carbon and hydrogen atoms, and may be either a saturated hydrocarbon or an unsaturated hydrocarbon. A saturated hydrocarbon compound contains only carbon single bonds, while an unsaturated compound contains carbon double or triple bonds. Suitable hydrocarbon compounds include alkanes, alkenes and alkynes.

Methods of depositing an amorphous carbon layer include optionally pre-mixing and introducing process gases to a substrate at both a pressure and temperature effective to form amorphous carbon. In embodiments, a total pressure of the process gases (or process gas mixture) may range from 1 to 50 mTorr. The substrate temperature may range from 25° C. to 400° C.

Porous dielectric thin films may be formed by selective removal of soluble porogens as known by those skilled in the art. A silicon-containing dielectric layer, for example, that initially contains soluble porogen material dispersed therein may be formed by chemical vapor deposition (CVD). Example porogen materials include germanium oxide and boron oxide, and example CVD precursors include germanic acid (H$_4$GeO$_4$) and boric acid (H$_3$BO$_3$) in addition to a suitable silicon source, such as an organosilicon compound.

Figure 4:
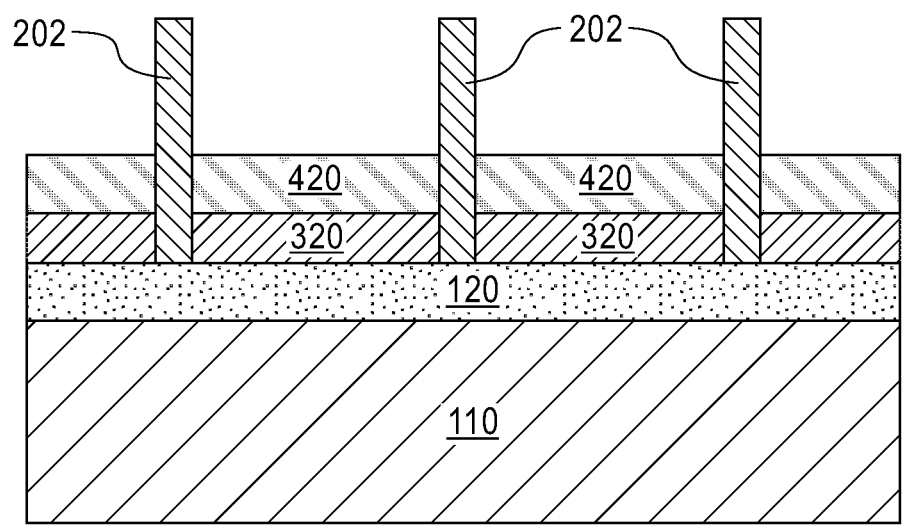
FIG. 4 shows the formation of a second sacrificial layer adjacent to the nanowires and over the first sacrificial layer.

As seen with reference to FIG. 4, a second sacrificial layer 420 is then formed over the first sacrificial layer 320 and adjacent to the nanowires 202. The second sacrificial layer 420 may comprise a dielectric material such as silicon nitride, for example, and have a thickness of 10 to 20 nm. Other dielectric materials may be employed as the second sacrificial layer 420 so long as the dielectric material that provides the second sacrificial layer 420 has a different etch selectivity than the material that provides the first sacrificial layer 320.

Figure 5A:
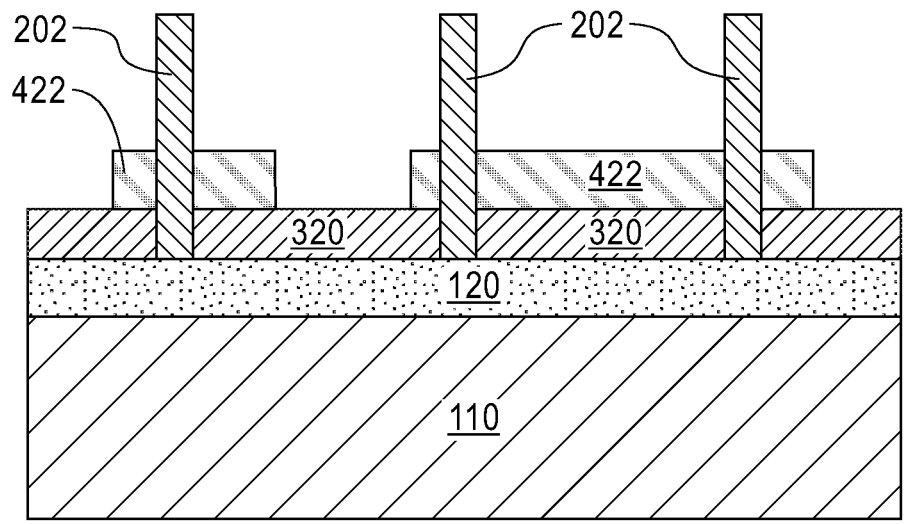
FIGS. 5A and 5B are cross-sectional and top-down plan view images of the structure of FIG. 4 after patterning the second sacrificial layer to form a sacrificial gate.
Figure 5B:
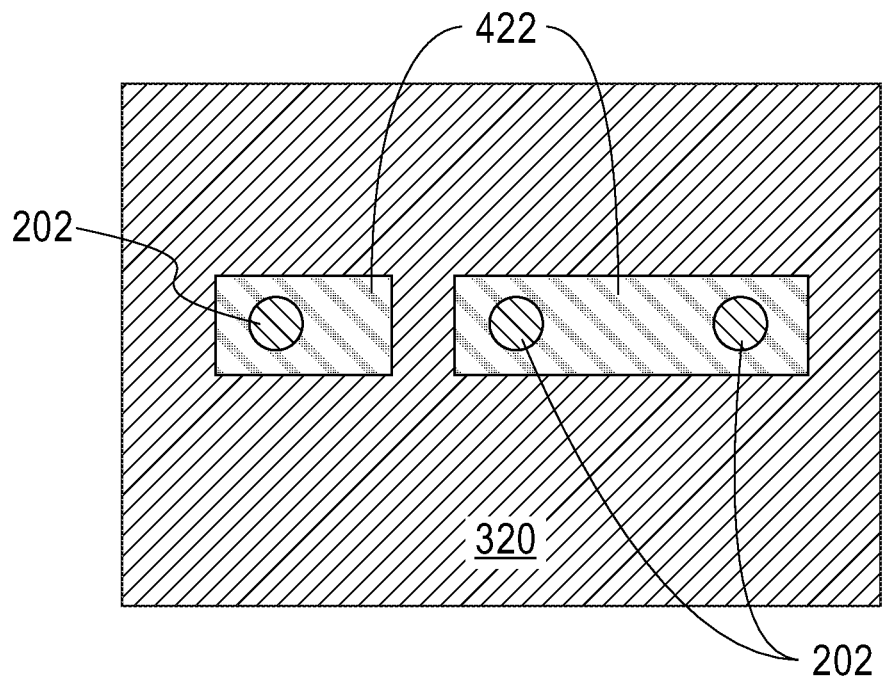

Turning to FIGS. 5A and 5B, photolithography and etching steps may be used to pattern the second sacrificial layer 420 to form a sacrificial gate 422. In embodiments, patterning and etching of the second sacrificial layer 420 exposes the first sacrificial layer 320, though nanowires 202 remain enveloped along a portion of their periphery by the sacrificial gate 422.

Figure 6A:
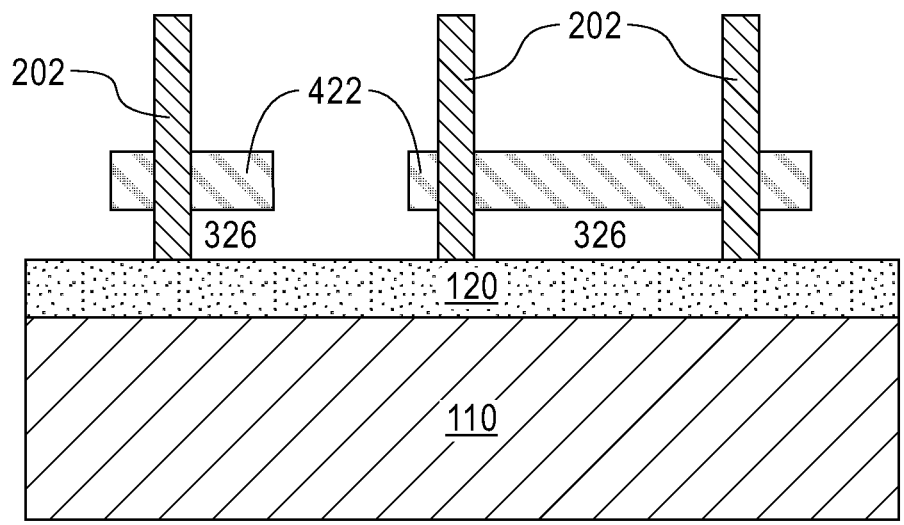
FIGS. 6A and 6B show removal of the first sacrificial layer.
Figure 6B:
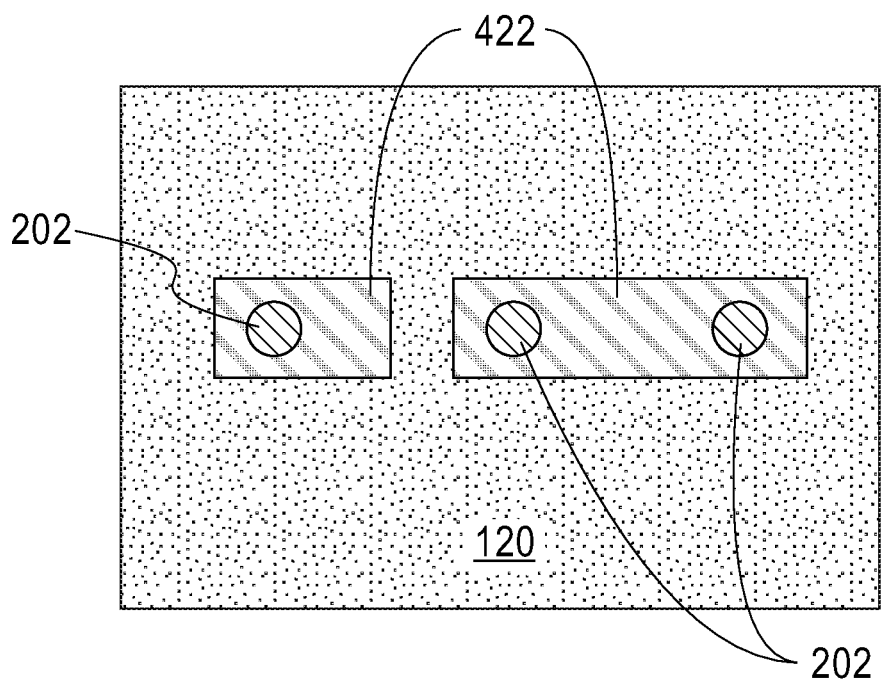

Then, as illustrated in FIGS. 6A and 6B, first sacrificial layer 320 is removed. A wet or dry etch may be used to selectively remove the first sacrificial layer 320. For example, the first sacrificial layer 320 formed from amorphous carbon may be removed using a wet etching comprising an acid such as sulfuric acid. Alternatively, the first sacrificial layer may be removed using a plasma ashing process, e.g., using an oxygen-based plasma such as an $O_2/N_2$-containing plasma. After removal of the first sacrificial layer 320, sacrificial gate 422 is anchored by nanowires 202 and suspended over substrate 100 to form a gap 326 there between.

Figure 7A:
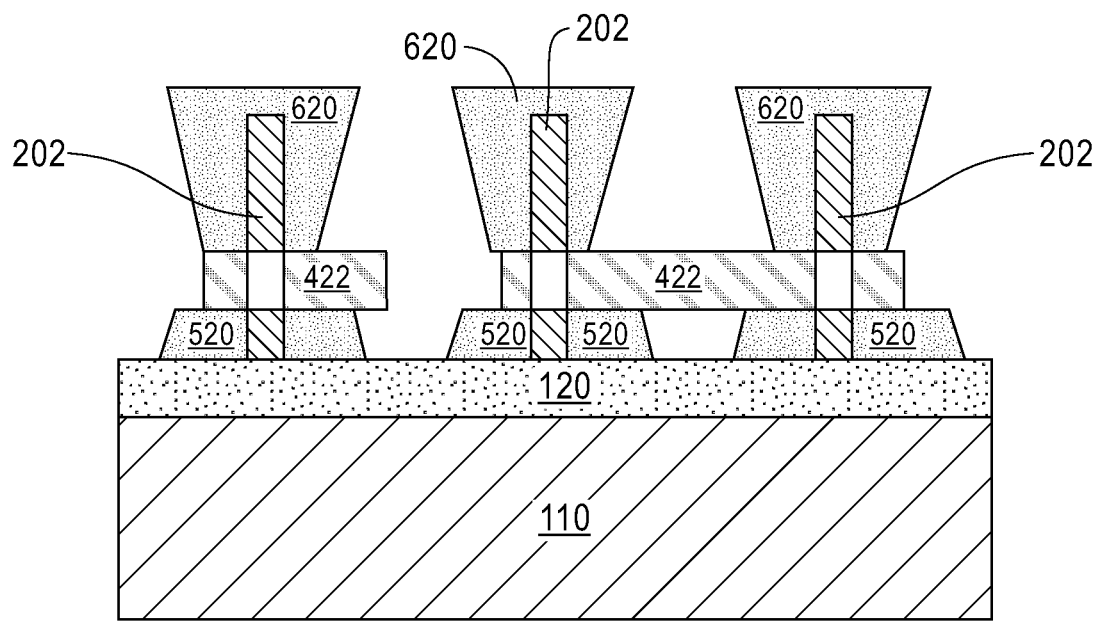
FIGS. 7A and 7B show the formation of source and drain regions adjacent to the nanowires and respectively below and above the sacrificial gate.
Figure 7B:
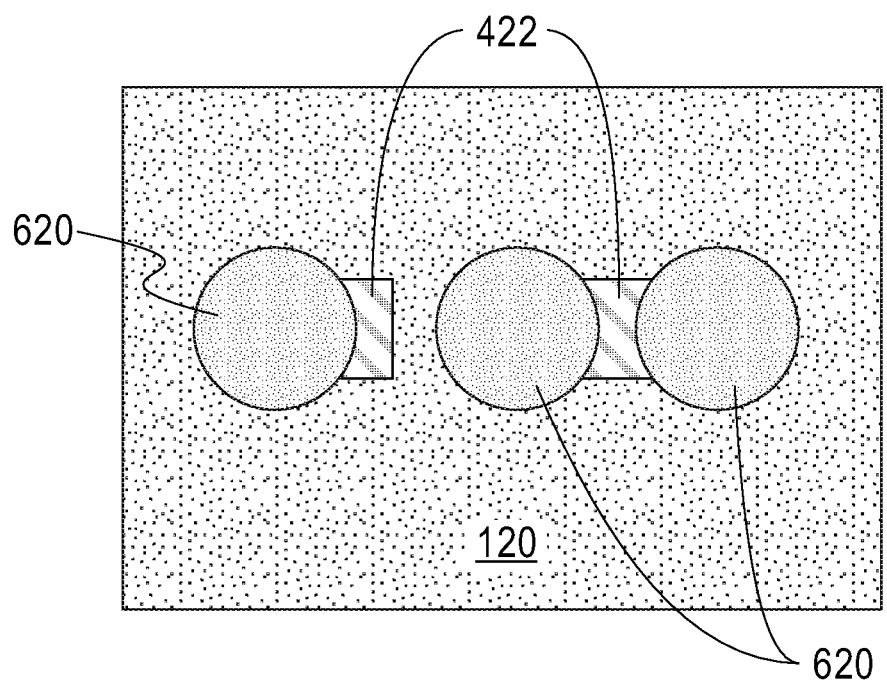

As shown in FIGS. 7A and 7B, source and drain regions 520, 620 are formed below and above sacrificial gate 422, respectively, via epitaxial growth on exposed surfaces of nanowires 202. Source regions 520 are formed within the gap 326. In embodiments, source and drain regions are formed simultaneously and may have a radial thickness (i.e., with respect to nanowires 202) of 10 to 30 nm. Thus, source and drain regions 520, 620 have an annular shape when viewed along a direction normal to the substrate. The thickness of the source and drain regions with respect to the surface of the nanowires 202 may be constant or variable. Referring to FIG. 7A, for example, the thickness of the source and drain regions may vary along with length of the nanowires due to shadowing or other geometric effects associated with the epitaxial growth. The source and drain regions may comprise silicon, e.g., single crystal silicon. By forming source and drain regions separately from the sacrificial gate, parasitic capacitance is advantageously reduced. Although the present application describes and illustrates the source region 520 being formed beneath the drain region 620, it is possible to form the drain region beneath the source region.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation.

The epitaxial source and drain regions 520, 620 may be doped. Doping changes the electron and hole carrier concentrations of an intrinsic semiconductor at thermal equilibrium. A doped layer or region may be p-type or n-type. A p-type dopant is used to manufacture a PFET and an n-type dopant is used to manufacture an NFET.

As used herein, "p-type" refers to the addition of impurities to an intrinsic semiconductor that creates a deficiency of valence electrons. For silicon, example p-type dopants, i.e., impurities, include but are not limited to, boron, aluminum, gallium, and indium. As used herein, "n-type" refers to the addition of impurities that contribute free electrons to an intrinsic semiconductor. For silicon, example n-type dopants, i.e., impurities, include but are not limited to, antimony, arsenic, and phosphorus. The dopant(s) may be introduced by plasma doping, or may be introduced, for example, in situ, i.e., during a process sequence used to form the layer.

By way of example, a dopant region may in-situ doped with arsenic or phosphorus to form an n-type region. The dopant concentration within the source and drain regions may range from $1\times10^{19}$ atoms/cm$^3$ to $1\times10^{22}$ atoms/cm$^3$, e.g., $1\times10^{20}$ atoms/cm$^3$ to $1\times10^{21}$ atoms/cm$^3$. In another example, a dopant region is in-situ doped with boron or $BF_2$ to form a p-type region. The dopant concentration within the source and drain regions may range from $1\times10^{19}$ atoms/cm$^3$ to $1\times10^{22}$ atoms/cm$^3$, e.g., $1\times10^{20}$ atoms/cm$^3$ to $1\times10^{21}$ atoms/cm$^3$.

An optional drive-in anneal can be used to diffuse dopant species and generate a desired dopant profile. In embodiments, dopant atoms within the source and drain regions 520, 620 may be diffused into the adjacent nanowires 202 using a post-epitaxy anneal (e.g., at a temperature of 600 to 1400° C.) to create a dopant profile within the nanowires proximate to the source and drain regions 520, 620. The dopant profile within the nanowires 202 may be constant or variable. For instance, the dopant concentration within the nanowires may vary radially, with a minimum dopant concentration (e.g., $1\times10^{19}$ to $1\times10^{22}$ atoms/cm$^3$) along a central axis of the nanowires and a maximum dopant concentration (e.g., $1\times10^{19}$ to $1\times10^{22}$ atoms/cm$^3$) at the periphery.

Figure 8A:
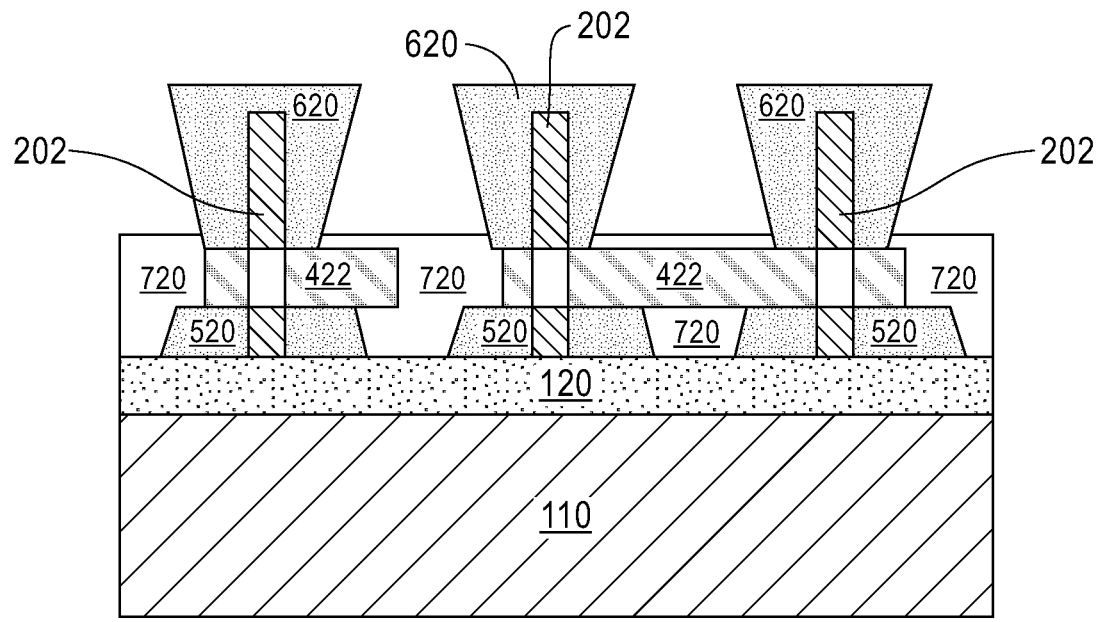
FIGS. 8A and 8B show the deposition and planarization of an interlayer dielectric.
Figure 8B:
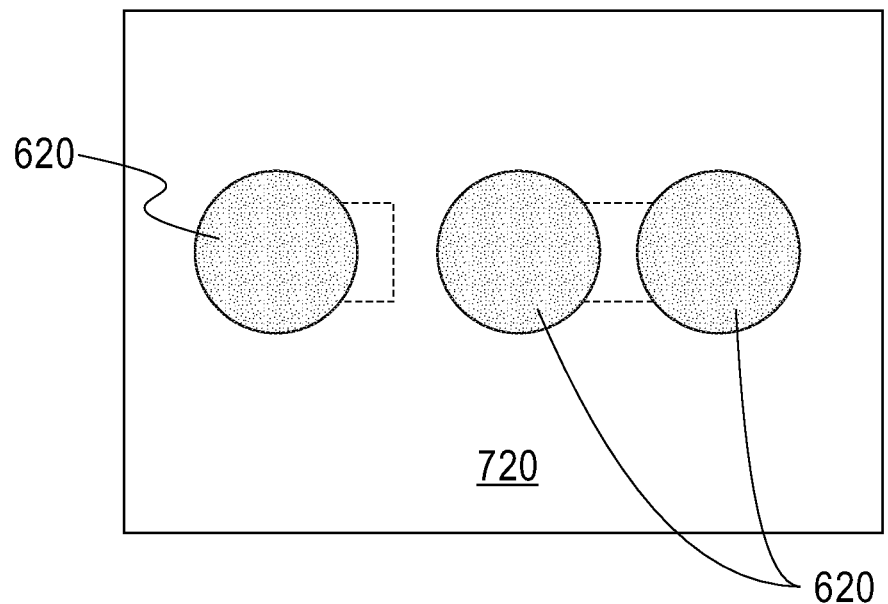
Figure 9A:
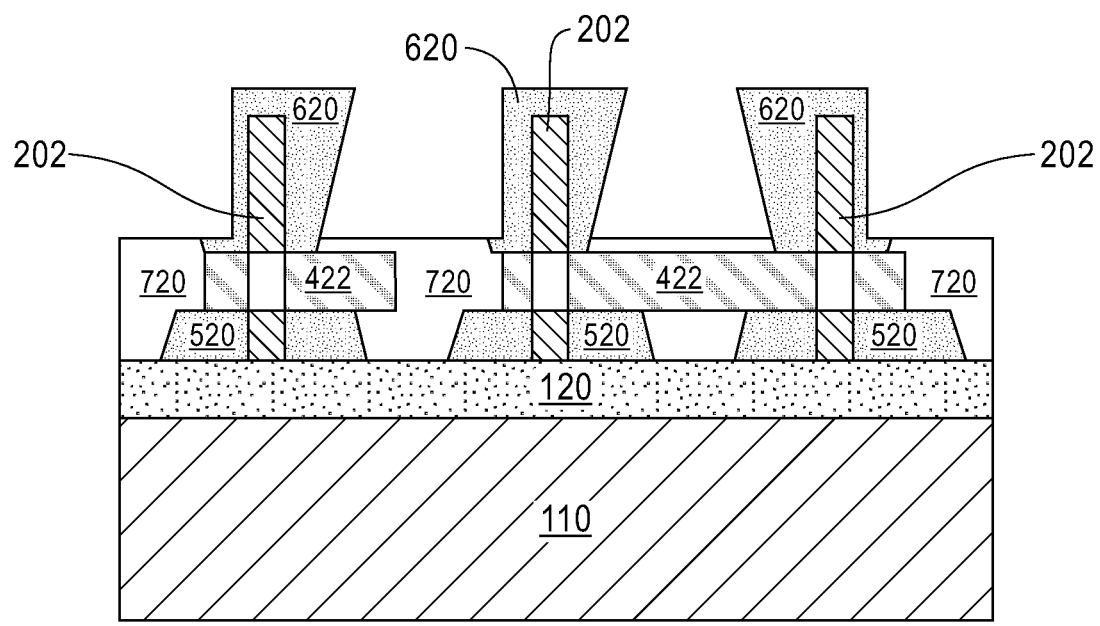
FIGS. 9A and 9B show the partial removal of the drain.
Figure 9B:
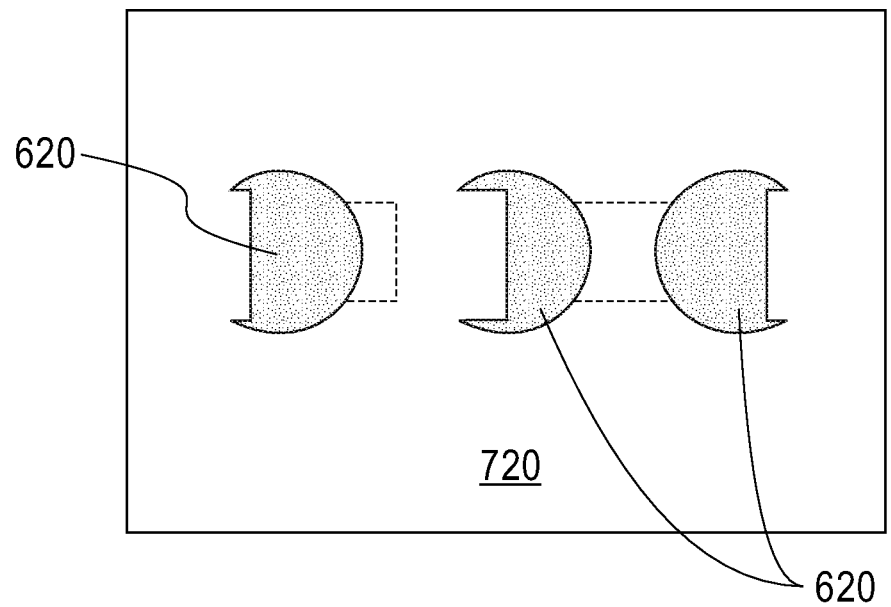
Figure 10A:
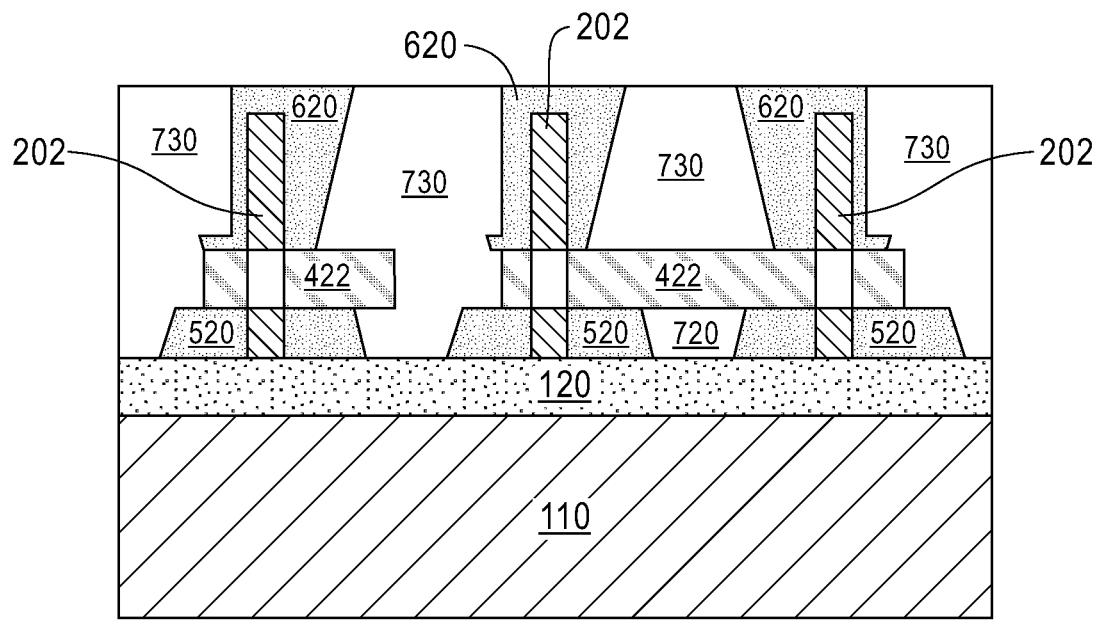
FIGS. 10A and 10B show the deposition and planarization of an interlayer dielectric.
Figure 10B:
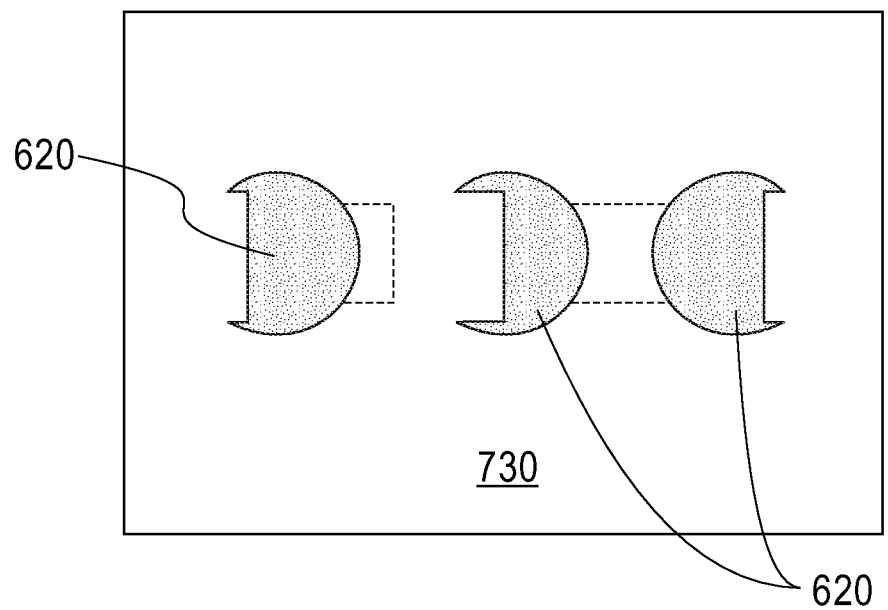

With reference to FIGS. 8A and 8B, following the formation of epitaxial source and drain regions 520, 620, a dielectric layer 720 is deposited over exposed surfaces of the structure. In some embodiments, the dielectric layer 720 is then planarized and etched back so as to cover source regions 520 and sacrificial gate 422. The dielectric layer 720 may be self-planarizing, or the top surface of the dielectric layer 720 can be planarized, for example, by chemical mechanical planarization (CMP). Chemical mechanical polishing (CMP) is a material removal process that uses both chemical reactions and mechanical forces to remove material and planarize a surface. Drain regions 620 may function as a CMP etch stop. In embodiments, the thickness of dielectric layer 720 over the sacrificial gate may be 0 to 10 nm. A vertical transistor architecture is shown that includes one or more vertical nanowires 202 connecting a source region 520 with a drain region 620.

Dielectric layer 720 may comprise silicon dioxide, silicon nitride, silicon oxynitride, a low-k material (i.e., a dielectric material having a dielectric constant of less than silicon dioxide), or any suitable combination of these materials. Exemplary low-k materials include but are not limited to, amorphous carbon, fluorine-doped oxides, carbon-doped oxides, SiCOH or SiBCN. Commercially-available low-k dielectric products and materials include Dow Corning's SiLK™ and porous SiLK™, Applied Materials' Black Diamond™, Texas Instrument's Coral™ and TSMC's Black Diamond™ and Coral™. The dielectric layer 720 may be deposited by plasma enhanced chemical vapor deposition (PECVD).

Referring next to FIGS. 9A, 9B, 10A and 10B, lithography and etching steps are used to optionally remove a portion of drain 620 in order to decrease a projected cross-sectional area thereof and create space adjacent to nanowires 202 through which contact vias will be formed in later steps. The resulting structure is backfilled with an additional dielectric layer 730, which is planarized to a height of the drain regions 620. Dielectric layer 730 may comprise the same dielectric material used for dielectric layer 720.

Figure 11A:
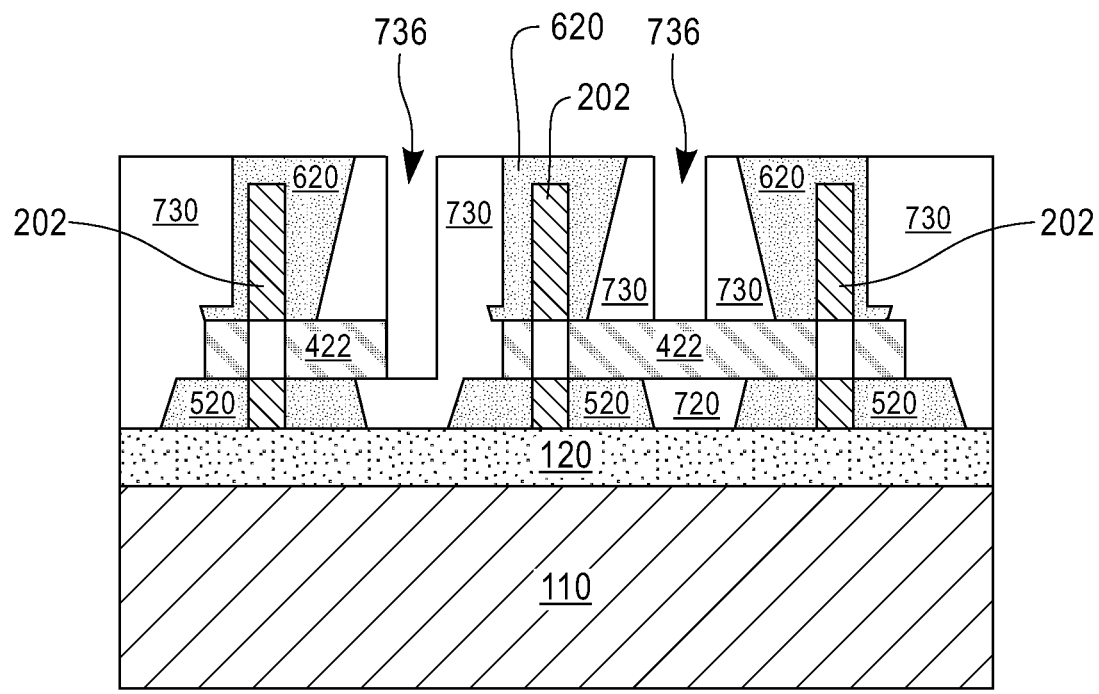
FIGS. 11A and 11B show the etching of gate contact vias into the dielectric layers of FIGS. 8 and 10.
Figure 11B:
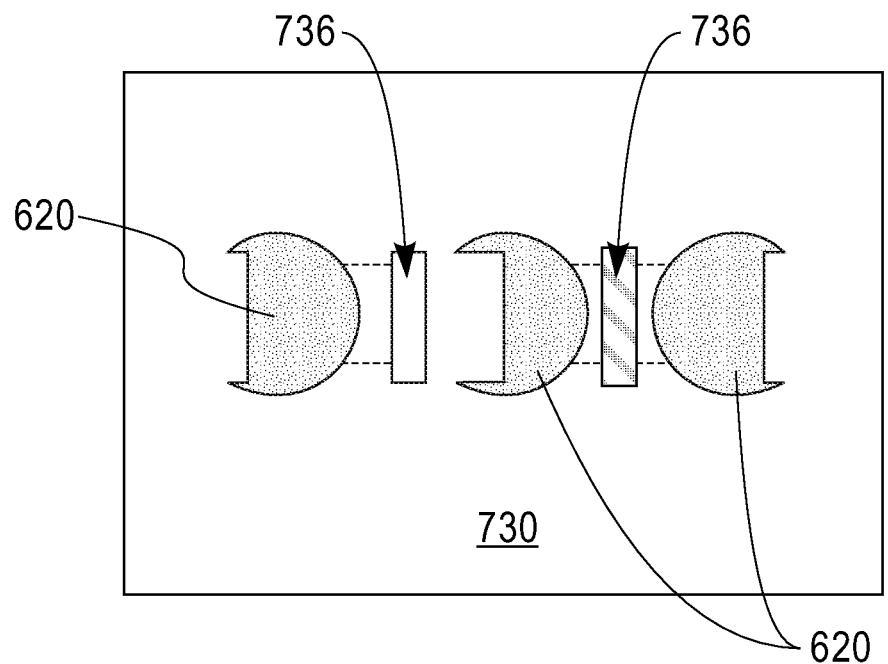

As seen with reference to FIGS. 11A and 11B, vias 736 are then etched into dielectric layers 720 and 730 to expose sacrificial gate 422. In the illustrated embodiment, both a sidewall surface and a top surface of the sacrificial gate 422 are exposed.

Figure 12A:
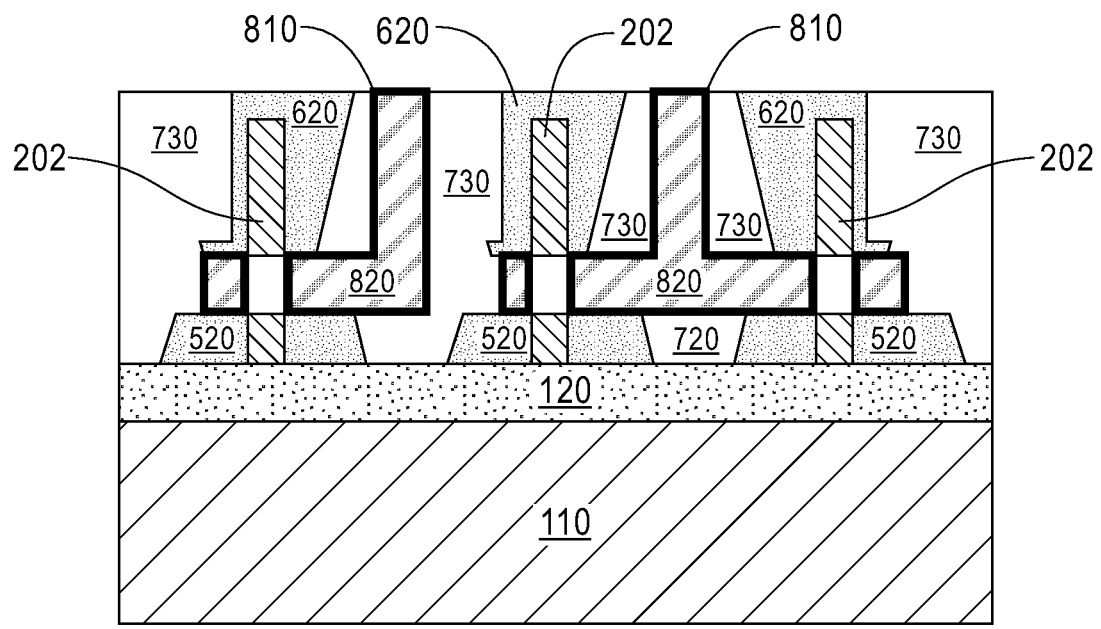
FIGS. 12A and 12B reveal an intermediate architecture after removal of the sacrificial gate and deposition of a replacement gate stack.
Figure 12B:
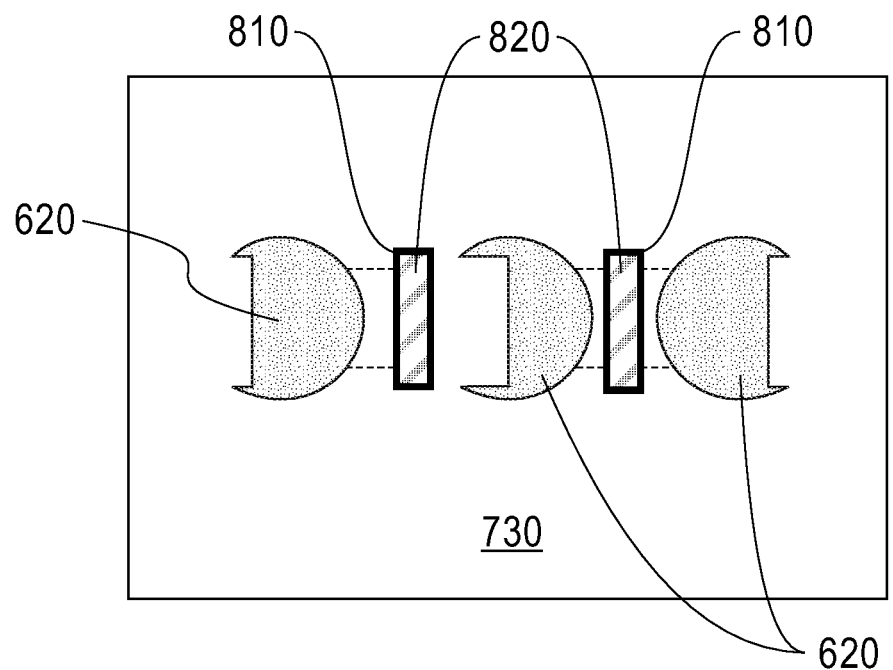

As known to those skilled in the art, a wet and/or dry etch is used to selectively remove the sacrificial gate 422. Then, as shown in FIGS. 12A and 12B, a gate stack is formed within vias 736 and the volume previously filled with the sacrificial gate. The gate stack comprises a gate dielectric 810 and a gate electrode 820, which are deposited in succession.

The gate dielectric 810 may be a conformal layer that is formed over exposed surfaces within the aforementioned volume, including a top surface of epitaxial source region 520, a bottom surface of epitaxial drain region 620, and sidewalls of the intermediate (channel) segment of nanowires 202.

Gate dielectric 810 may comprise silicon dioxide, silicon nitride, silicon oxynitride, a high-k dielectric, or other suitable material. As used herein, a high-k material has a dielectric constant greater than that of silicon nitride. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2.

The gate dielectric 810 may be deposited by a suitable process such as atomic layer deposition (ALD), chemical vapor deposition (CVD), physical vapor deposition (PVD), thermal oxidation, UV-ozone oxidation, or combinations thereof. The gate dielectric thickness may range from 1 nm to 10 nm, e.g., 1, 2, 4, 6, 8 or 10 nm, including ranges between any of the foregoing.

The gate electrode 820 may include a conductive material such as polysilicon, silicon-germanium, a conductive metal such as Al, W, Cu, Ti, Ta, W, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate electrode 820 may comprise one or more layers of such materials such as, for example, a metal stack including a work function metal layer and/or a liner.

The gate electrode 820 can be formed utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition.

In embodiments, the overlap area can be minimized between each of the source region and the gate stack, and the drain region and the gate stack, e.g., by forming source and drain regions with tapered sidewalls.

Figure 13A:
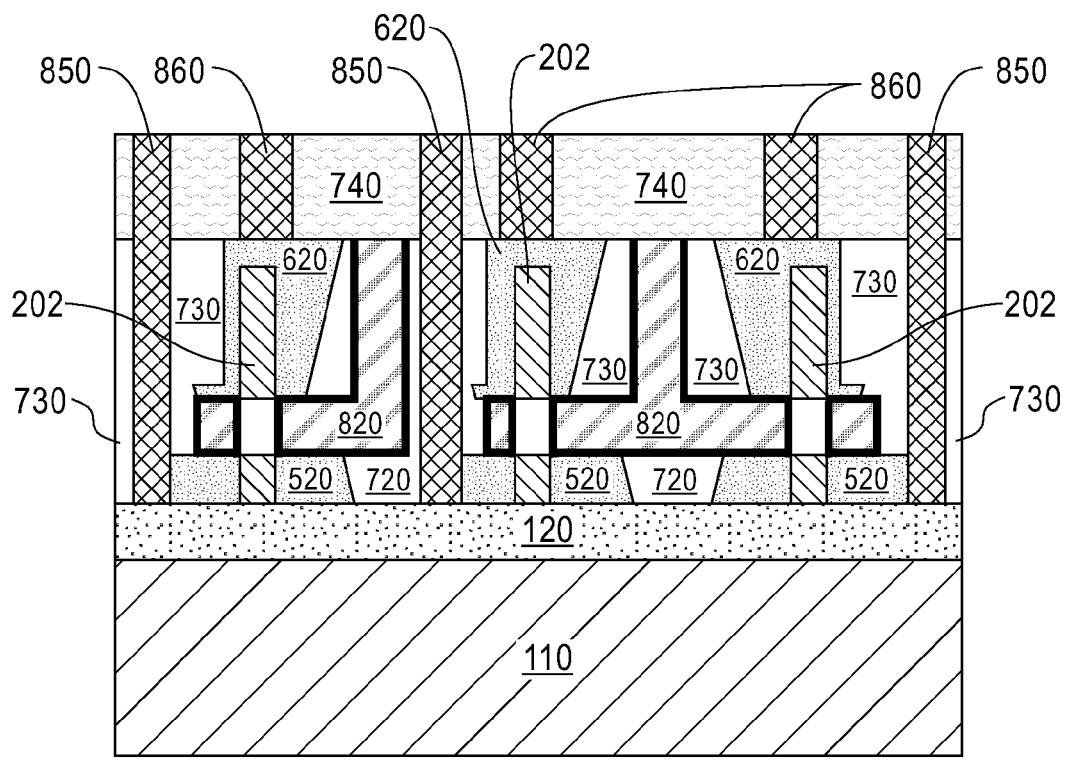
FIGS. 13A and 13B show the deposition of a further interlayer dielectric and the formation of source and drain contacts.
Figure 13B:
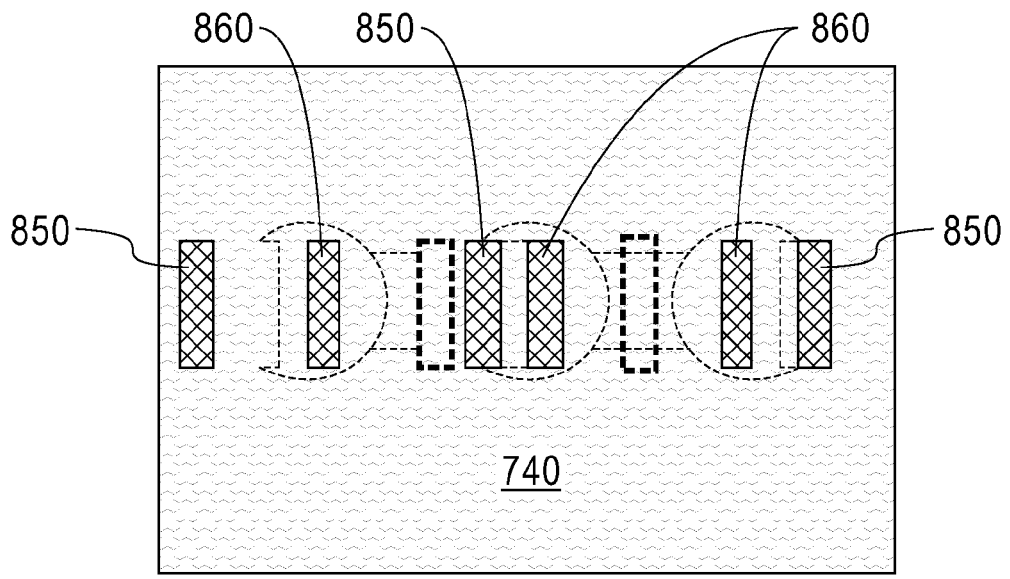

As seen in FIGS. 13A and 13B, a further dielectric layer 740 is deposited over the architecture of FIGS. 12A and 12B, and source/drain contacts 850, 860 are formed extending through a portion of at least one of the dielectric layers 720, 730, 740. Source/drain contacts 850, 860 may be formed using a deposition process such as ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition, and may comprise a conductive metal such as Al, W, Cu, Ti, Ta, W, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof.

Illustrated in FIGS. 1-13 are embodiments of a process to form a vertical field effect transistor as well as the resulting structure. Absent from the gate of the resulting structure is a sidewall spacer, which simplifies the process flow.

As used herein, the singular forms "a," "an" and "the" include plural referents unless the context clearly dictates otherwise. Thus, for example, reference to a "nanowire" includes examples having two or more such "nanowires" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a dielectric layer that comprises silicon nitride include embodiments where a dielectric layer consists essentially of silicon nitride and embodiments where a dielectric layer consists of silicon nitride.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed as new is:

1. A method of fabricating a vertical field effect transistor, comprising:
   forming a semiconductor nanowire extending from a substrate surface;
   depositing a first sacrificial layer over the substrate surface and surrounding the semiconductor nanowire, wherein the first sacrificial layer contacts a sidewall of a lower portion of the semiconductor nanowire and has a topmost surface that is below a topmost surface of the semiconductor nanowire;

depositing a second sacrificial layer over the first sacrificial layer and surrounding the semiconductor nanowire, wherein the second sacrificial layer contacts the sidewall of a middle portion of the semiconductor nanowire and has a topmost surface that is below the topmost surface of the semiconductor nanowire;

patterning the second sacrificial layer to form a sacrificial gate;

removing the first sacrificial layer to expose the sidewall of the lower portion of the semiconductor nanowire and to provide a gap between the sacrificial gate and the substrate surface;

epitaxially growing a bottom source/drain region in the gap and on the sidewall of the lower portion of the semiconductor nanowire, and a top source/drain region from an exposed surface of an upper portion of the semiconductor nanowire, wherein the bottom source/drain region is vertically spaced apart from the top source/drain region by the sacrificial gate; and replacing the sacrificial gate with a gate stack comprising a gate dielectric layer and a conductive electrode to provide the vertical field effect transistor wherein a portion of the gate stack is positioned beneath the top source/drain region and above the bottom source/drain region.

2. The method of claim 1, wherein the substrate surface comprises a dielectric material.

3. The method of claim 1, wherein the first sacrificial layer comprises amorphous carbon.

4. The method of claim 1, wherein the sacrificial gate comprises a dielectric material.

5. The method of claim 1, wherein a contact area between the bottom source/drain region and the sacrificial gate is less than a contact area between the bottom source/drain region and the substrate surface.

6. The method of claim 1, further comprising etching the top source/drain region to decrease a projected cross-sectional area thereof.

7. The method of claim 1, further comprising depositing a dielectric layer over the sacrificial gate and etching vias in the dielectric layer to expose the sacrificial gate.

8. The method of claim 7, further comprising etching the sacrificial gate through the vias.

9. The method of claim 1, wherein the gate dielectric layer is deposited on the sidewall of the middle portion of the semiconductor nanowire and between the top and bottom source/drain regions.

10. The method of claim 1, wherein the gate dielectric layer is deposited on the sidewall of the middle portion of the semiconductor nanowire, and the top and bottom source/drain regions.

11. The method of claim 1, wherein a topmost surface of the top source/drain region is coplanar with a topmost surface of the gate stack.

* * * * *